(12) United States Patent
Lee

(10) Patent No.: US 6,690,231 B1
(45) Date of Patent: Feb. 10, 2004

(54) GAIN STAGE THAT MINIMIZES THE MILLER EFFECT

(75) Inventor: Sheng-Hann Lee, Saratoga, CA (US)

(73) Assignee: Ralink Technology, Inc., Cupertino, CA (US)

( * ) Notice: Subject to any disclaimer, the term of this patent is extended or adjusted under 35 U.S.C. 154(b) by 0 days.

(21) Appl. No.: 10/127,909

(22) Filed: Apr. 22, 2002

(51) Int. Cl.[7] .................................................. G06G 7/12
(52) U.S. Cl. ........................................ 327/560; 327/562
(58) Field of Search ................................ 327/560, 561, 327/562, 563

(56) References Cited

U.S. PATENT DOCUMENTS

| | | | | |
|---|---|---|---|---|
| 4,132,963 A | * | 1/1979 | Page ............................ | 330/283 |
| 4,656,436 A | * | 4/1987 | Saari ............................ | 330/253 |
| 5,430,641 A | * | 7/1995 | Kates ........................... | 363/133 |
| 5,491,641 A | * | 2/1996 | Scepanovic et al. .......... | 716/13 |
| 6,107,885 A | * | 8/2000 | Miguelez et al. ............ | 330/276 |

FOREIGN PATENT DOCUMENTS

| | | | | |
|---|---|---|---|---|
| JP | | 11088064 A | * 3/1999 | ............. H03F/1/42 |

* cited by examiner

*Primary Examiner*—Timothy P. Callahan
*Assistant Examiner*—Cassandra Cox
(74) *Attorney, Agent, or Firm*—Sawyer Law Group LLP

(57) ABSTRACT

A gain stage is disclosed. The gain stage comprises a first stage that provides two voltages of equal and opposites polarities and a plurality of devices cross coupled to the first stage. The plurality of devices minimize the Miller Effect capacitance in the differential stage by providing an out-of-phase signal to the first stage. Accordingly, a system and method in accordance with the present invention utilizes an at least one extra device on the same die as the first stage to provide an impedance match. In so doing, a broadband cancellation of the Miller Effect is achieved. Moreover, the matching is valid over an extended temperature range.

16 Claims, 4 Drawing Sheets

GAIN STAGE THAT MINIMIZES THE MILLER EFFECT

FIELD OF THE INVENTION

The present invention relates generally to active devices which are utilized to provide a gain and more particularly to a system and method for minimizing the Miller Effect in such devices.

BACKGROUND OF THE INVENTION

FIG. 1 illustrates a typical active device 10 (i.e., a transistor) which includes a Miller feedback capacitance 12. In any three-terminal active device, there exists a feedback (Miller) capacitance between the input and output terminals as shown in FIG. 1, which causes gain reduction and degrades isolation and stability of the device in high frequencies. That phenomenon is commonly known as Miller Effect.

FIG. 2 illustrates a simple circuit 20 model illustrating the active device when determining the figure of merit ($f_T$). The circuit 20 includes an input resistance ($R_m$) 22 coupled in parallel to an input capacitor ($C_{in}$) 24. The parallel resistor/capacitor combination is coupled to a current source 26. The current gain (Beta) for such a device is defined by Iin/Iout.

The parameter called $f_T$ defines the figure of merit for any technology, which is the ratio of transconductance and input capacitance of a three terminal device such as the transistor 10. As is well known, at high frequencies f is defined by the following equation:

$$f_T = gm/(2*\Pi*C_{in}), \text{ where gm=the gain.} \quad (1)$$

It is well known that $f_T$ is a good measure of the performance of a device based upon process parameters. However, circuit performance of the device must also be determined. Measurement of circuit performance of a device is accomplished by placing a load on the output of the device.

FIG. 3 illustrates a circuit model 30 which includes a load resistance (RL) 32 and the Miller Effect capacitance $C_m$ 31. The figure of merit for device performance is the maximum oscillation frequency ($f_{max}$). The Miller Effect capacitance is a limitation to any device technology. Despite progress made in each successive generation of technology that pushes the speed higher and higher, Miller Effect capacitance always becomes a limiting factor in high-frequency operation of such devices. For a more specific description of this problem, refer now to the following discussion.

$F_{max}$ is related to the $f_T$ approximately by the following equation:

$$f_{max} \approx \sqrt{(f_T/(8*\pi*R_{Series}*C_{Feedback}))} \quad (2)$$

where $R_{Series}$ is the series resistance at the input terminal.

As a rule of thumb, high-frequency gain rolls off at 6 dB per octave. And when it reaches 0 dB, that frequency is called $f_{Max}$. The circuit should operate at frequencies much below the $f_{Max}$ to have meaningful gain. Unfortunately, the $f_{Max}$ also is a fixed parameter for a given technology.

So at high frequencies the limitation is accepted as is or a cascode stage or neutralization is provided for better performance. Both of these alternatives have limitations, however. For a description of these two alternatives, refer now to the following discussion FIG. 4 illustrates a typical cascode stage configuration 50. The cascode stage configuration 50 feeds the output of a first device 52 into the emitter (or the source, if it is a FET) of a second device 54. It is known that the Miller Effect capacitance will manifest the total capacitance at the input by:

$$C_{Total} = (1-K)*C_{Feedback} + C_{in},$$

where K is the voltage gain between the output and input. In an ideal cascode stage K=−1.

Accordingly, the gain for the output can be held stable under most conditions. However, the cascode stage configuration 50 has several problems. Firstly, the gain of the lower device is maximized at 1. Hence, the distortion voltage doubles as both upper and lower devices make equal contributions in distortion from same voltage swing simultaneously.

Secondly, at low voltages (i.e., 3.3 Volts or less), headroom of voltage for operation is limited due to the voltage drops required across both of the transistors.

The second approach is referred to as a neutralization technique. FIG. 5 illustrates a typical single device stage 60 with neutralization. In this technique, a capacitance is introduced to provide a positive feedback via a unity-gain phase inverter 66 to cancel the negative feedback from Miller Effect capacitor 62. This technique has been applied to vacuum tube, bipolar and FET stages.

However, the neutralization technique is based on the assumption that the added capacitance will match the feedback capacitance exactly. Whether it is from part to part, from temperature to temperature, or from frequency to frequency. Finally, the neutralization technique requires the phase inverter to provide unity gain. Skillful designers know those conditions are impossible to meet in production.

So for circuits utilizing a neutralization technique, manual tuning is a necessity in production. It also means risk of oscillation, as exact neutralization is not guaranteed over the temperature and frequency.

Accordingly, what is needed is a system and method for providing an active device where the Miller Effect capacitance is minimized which overcomes the above-identified problems. The device should be cost effective, compatible with existing processes and easily implemented. The present invention addresses such a need.

SUMMARY OF THE INVENTION

A gain stage is disclosed. The gain stage comprises a first stage that provides two voltages of equal and opposites polarities and a plurality of devices cross coupled to the first stage. The plurality of devices minimize the Miller Effect capacitance in the differential stage by providing an out-of-phase signal to the first stage Accordingly, a system and method in accordance with the present invention utilizes at least one device on the same die as the first stage to provide an impedance match. In so doing, a broadband cancellation of the Miller Effect is achieved. Moreover, the matching is valid over an extended temperature range.

DETAILED DESCRIPTION

The present invention relates generally to active devices and more particularly to a system and method for minimizing the Miller Effect in such devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In a system and method in accordance with the present invention, a pair of extra devices that provide an independent match for the devices of a first stage that provides two voltages of equal and opposite polarities are cross coupled between differential outputs and inputs on the same die of a semiconductor substrate. Because modem technology can provide a very good device match if the devices are placed in close proximity, a broadband cancellation of the Miller Effect can be achieved consistently. Moreover, since the devices are on the same die the matching is valid over an extended temperature range.

For a more detailed description of the features of the present invention, refer now to the following discussion in conjunction with the accompanying figures. Although the present invention will be described in the context of using a bipolar device, one of ordinary skill in the art will readily recognize that a variety of devices could be herein. Accordingly, the devices could be CMOS, FET, HBT or any other type of active device and its use would be within the spirit and scope of the present invention.

Figure 1:
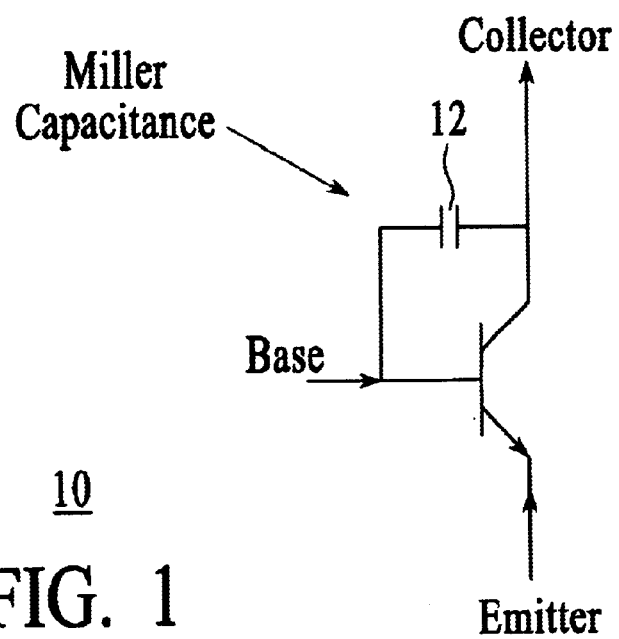
FIG. 1 illustrates a typical single device configuration shown with Miller Feedback capacitance.
Figure 2:
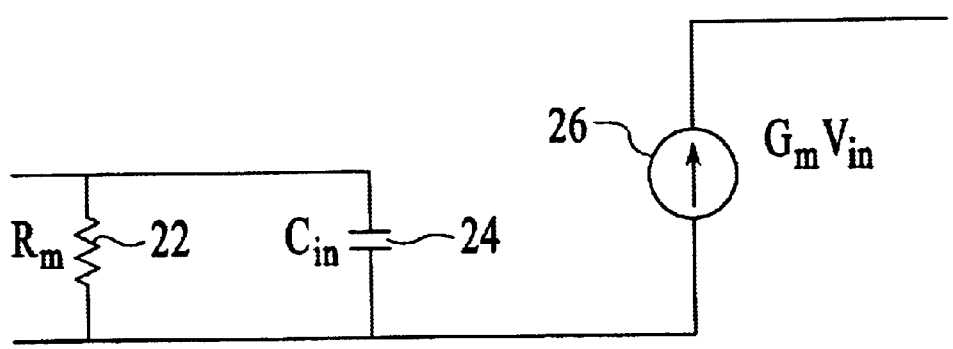
FIG. 2 illustrates a simple circuit model illustrating the active device when determining the figure of merit ($f_T$).
Figure 3:
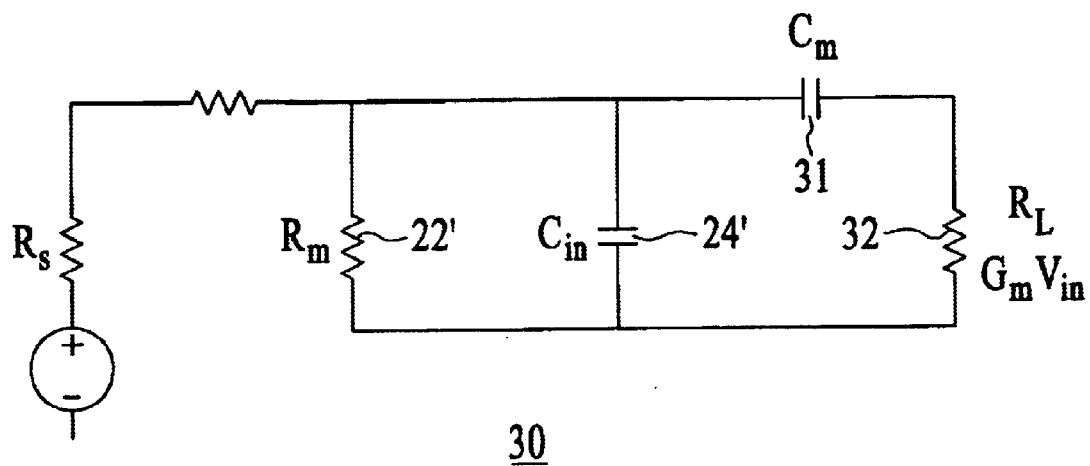
FIG. 3 illustrates a circuit model which includes a load resistance (RL) and the Miller Effect capacitance $C_m$.
Figure 4:
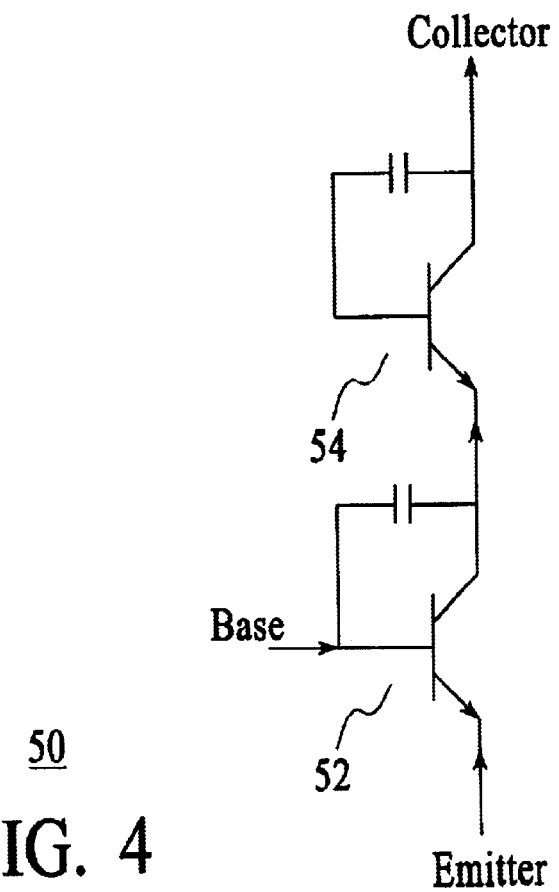
FIG. 4 illustrates a typical cascode stage configuration.
Figure 5:
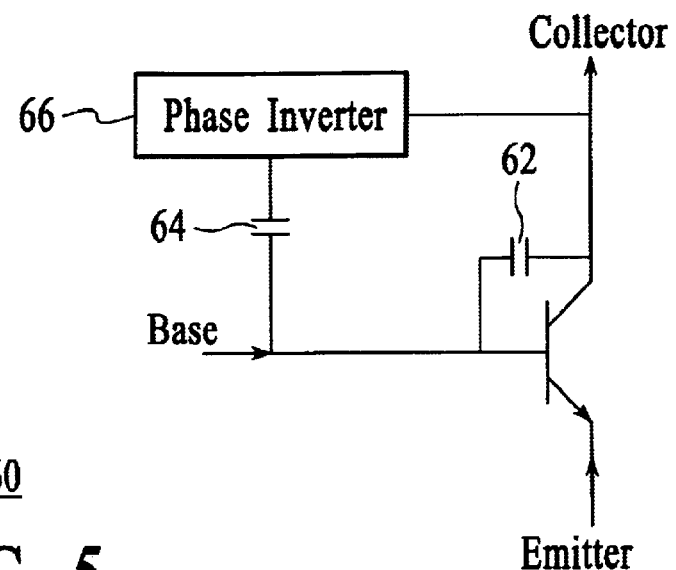
FIG. 5 illustrates a typical single device stage with neutralization.
Figure 6:
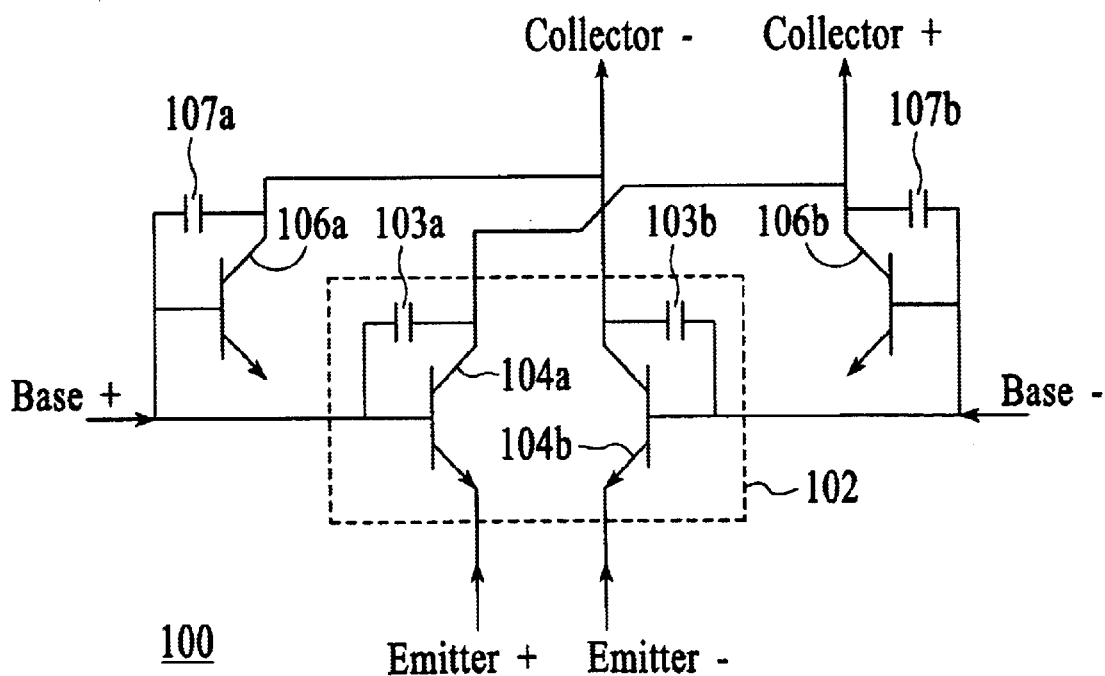
FIG. 6 illustrates a first embodiment of a gain stage in accordance with the present invention.

FIG. 6 illustrates a first embodiment of gain stage 100 in accordance with the present invention. As is seen in this embodiment, a differential stage 102 is provided in which an input to the emitter of transistor 104a is positive and the input to the emitter of transistor 104b is negative. As is also seen, the collector of the transistor 104a is cross-coupled to the collector of a transistor 106b and the collector of transistor 104b is cross-coupled to the collector 106a. The base of transistor 106a is coupled to the base of transistor 104a and the base of transistor 106b is coupled to the base of transistor 104b. The output voltages at the collectors of transistors 104a and 104b are of equal but opposite polarity.

By making the transistors 106a and 106b identical to the transistors 104a and 104b and manufacturing them on the same die of a semiconductor substrate using conventional technologies, the Miller Effect capacitances 103a and 103b of the transistors 104a and 104b, respectively, can be cancelled by the capacitances of 107a and 107b due to the inverted polarity of the devices. Since the devices are manufactured together, the capacitances can be matched very closely. In so doing, the Miller Effect capacitance can be effectively cancelled over a wide frequency range to allow for larger gains than when utilizing conventional gain stages.

Figure 7:
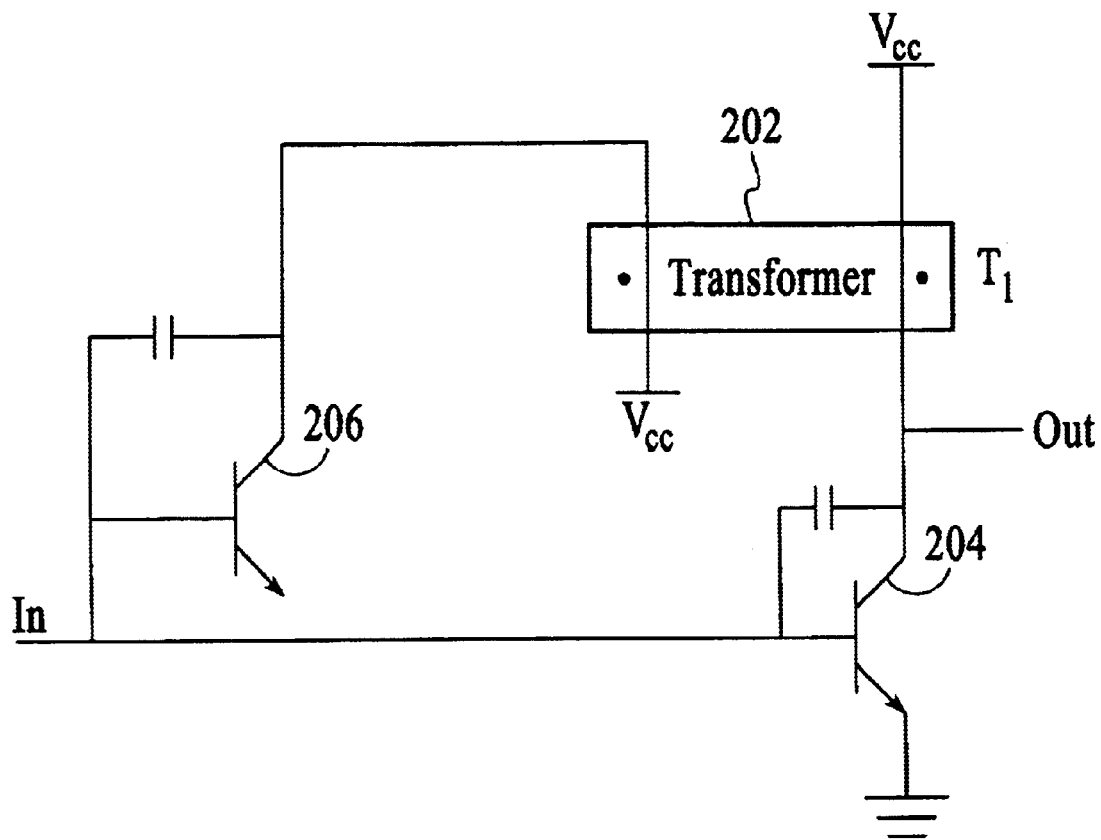
FIG. 7 illustrates a single ended gain stage in accordance with the present invention.

FIG. 7 illustrates a single-ended gain stage 200 in accordance with the present invention. The single-ended gain stage 200 is popular in RF design. In this embodiment, a printed transformer 202 on the die provides phase inversion with unity gain. The voltage ratio of a transformer 202 is proportional to its turn ratio if the load impedance is high. Accordingly, in this embodiment, since transistors 204 and 206 are on the same die, the Miller Effect capacitance 203 of transistor 206 cancels the Miller Effect capacitance 205 of transistor 204 to allow larger gains than in conventional gain designs.

Accordingly, a system and method in accordance with the present invention utilizes a pair of extra devices on the same die as the first stage, which provides two voltages of equal and opposite polarities to provide an impedance match. In so doing, a broadband cancellation of the Miller Effect is achieved. Moreover, the matching is valid over an extended temperature range.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A gain stage comprising:

a differential stage, the differential stage further comprising first and second active devices; and a plurality of devices cross coupled to the differential stage, the plurality of devices further comprising first and second extra active devices and the first and second extra active devices are identical to the first and second active devices, wherein the first and second extra active devices are impedance matched to the first and second active devices; wherein the first and second active devices receive signals of opposite polarities; wherein the differential stage and the plurality of devices are on a same die of a semiconductor substrate; and wherein a collector of the first active device is coupled to the collector of the second extra active device and a collector of the second active device is coupled to the collector of the first extra active device, and wherein the base of the first active device is coupled to the base of the first extra active device and the base of the second active device is coupled to the base of the second extra active device.

2. A gain stage comprising:

a differential stage, the differential stage further comprising first and second active devices; and a plurality of devices cross coupled to the differential stage, the plurality of devices further comprising first and second extra active devices and the first and second extra active devices are identical to the first and second active devices; wherein the plurality of devices minimize the Miller Effect capacitance in the differential stage wherein a collector of the first active device is coupled to a collector of the second extra active device and a collector of the second active device is coupled to a collector of the first extra active device, and wherein a base of the first active device is coupled to a base of the first extra active device and a base of the second active device is coupled to a base of the second extra active device.

3. A gain stage comprising:

a first stage that provides two equal voltages of opposite polarities, wherein the first stage comprises a transformer and an active device coupled to the transformer; and at least one device cross coupled to the first stage, wherein the at least one device minimizes the Miller Effect capacitance in the first stage.

4. A gain stage comprising:

a first stage comprising a transformer and a first active device coupled to the transformer; and a second active device cross-coupled to the first stage, wherein the second active device minimizes the Miller Effect capacitance, wherein the first and second active devices are identical and wherein the first and second active devices receive signals of equal and opposite polarities from the transformer.

5. The gain stage of claim 4 wherein the first active device, the second active device and transformer are on the same die.

6. A gain stage comprising:

a first stage that provides two equal voltages of opposite polarities, wherein the first stage comprises a differential stage and wherein the differential stage comprises first and second active devices; and at least one device cross coupled to the first stage, wherein the at least one devices minimizes the Miller Effect capacitance in the first stage and wherein the at least one device is impedance matched to the first and second active devices.

7. The gain stage of claim 6 wherein the first and second active devices comprise any of a CMOS device, FET device, HBT device and bipolar device.

8. The gain stage of claim 6 wherein the first and second active devices receive signals of opposite polarities.

9. The gain stage of claim 6 wherein the first stage and the at least one device are on a same die of a semiconductor substrate.

10. The gain stage of claim 6 wherein the at least one device comprises a first and second extra active device and the first and second extra active devices are identical to the first and second active devices.

11. The gain stage of claim 10 wherein a collector of the first active device is coupled to a collector of the second extra active device and a collector of the second active device is coupled to a collector of the first extra active device, and wherein a base of the first active device is coupled to a base of the first extra active device and a base of the second active device is coupled to a base of the second extra active device.

12. A gain stage comprising:

a differential stage, the differential stage further comprising first and second active devices; and a plurality of devices cross coupled to the differential stage, the plurality of devices further comprising first and second extra active devices and the first and second extra active devices are identical to the first and second active devices; wherein the plurality of devices minimize the Miller Effect capacitance in the differential stage and wherein the first and second extra devices are impedance matched to the first and second active devices.

13. The gain stage of claim 12 wherein the first and second active devices comprise any of a CMOS device, FET device, HBT device and bipolar device.

14. The gain stage of claim 12 wherein the first and second active devices receive signals of opposite polarities.

15. The gain stage of claim 12 wherein the differential stage and the plurality of devices are on a same die of a semiconductor substrate.

16. The gain stage of claim 12 wherein a collector of the first active device is coupled to a collector of the second extra active device and a collector of the second active device is coupled to a collector of the first extra active device, and wherein a base of the first active device is coupled to a base of the first extra active device and a base of the second active device is coupled to a base of the second extra active device.

* * * * *